US010659068B2

(12) United States Patent
Yamamoto (10) Patent No.: US 10,659,068 B2
(45) Date of Patent: May 19, 2020

(54) DA CONVERTER, DA CONVERTING METHOD, ADJUSTING APPARATUS, AND ADJUSTING METHOD

(71) Applicant: Asahi Kasei Microdevices Corporation, Tokyo (JP)

(72) Inventor: Ryuzo Yamamoto, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 16/231,951

(22) Filed: Dec. 25, 2018

(65) Prior Publication Data

US 2019/0131987 A1    May 2, 2019

Related U.S. Application Data

(63) Continuation of application No. PCT/JP2017/024327, filed on Jul. 3, 2017.

(30) Foreign Application Priority Data

Jul. 5, 2016   (JP) .................................. 2016-133729

(51) Int. Cl.
*H03M 1/06* (2006.01)
*H03M 1/66* (2006.01)
(Continued)

(52) U.S. Cl.
CPC ............ *H03M 1/0614* (2013.01); *H03F 3/45* (2013.01); *H03F 3/45475* (2013.01);
(Continued)

(58) Field of Classification Search
CPC ........ H03M 1/0614; H03M 1/10; H03M 1/66; H03F 3/45; H03F 3/45475
(Continued)

(56) References Cited

U.S. PATENT DOCUMENTS 4,833,473 A * 5/1989 Dingwall ................ H03M 7/14
333/124
6,337,647 B1 * 1/2002 Masson ............... H03M 1/0863
332/109

(Continued)

FOREIGN PATENT DOCUMENTS

JP        S6029022 A     2/1985
JP        360163839 U   10/1985
(Continued)

OTHER PUBLICATIONS

International Search Report for International Patent Application No. PCT/JP2017/024327, issued by the Japan Patent Office dated Sep. 19, 2017.

(Continued)

*Primary Examiner* — Lam T Mai (57) ABSTRACT

A DA converter to reduce second-order harmonic distortion more precisely with convenient configurations. A DA converter including: a DA converting unit to input reference voltage and a digital value and output an analog signal according to the digital value based on the reference voltage; and a superimposing unit to superimpose, on the reference voltage, a superimposing signal based on the analog signal that is output from the DA converting unit, and a DA converting method are provided. The DA converter may further include a setting input unit to input setting regarding at least one of a superimposing amount and a sign of an analog signal to be included in the superimposing signal. Also, an adjusting apparatus and an adjusting method to adjust the DA converter are provided.

25 Claims, 4 Drawing Sheets

(51) Int. Cl.
*H03M 1/10* (2006.01)
*H03F 3/45* (2006.01)

(52) U.S. Cl.
CPC ............... *H03M 1/10* (2013.01); *H03M 1/66* (2013.01); *H03F 2203/45156* (2013.01)

(58) Field of Classification Search
USPC .................................................. 341/118–155
See application file for complete search history.

(56) References Cited

U.S. PATENT DOCUMENTS

| | | | | |
|---|---|---|---|---|
| 9,246,503 B1* | 1/2016 | Hamilton | ............ | H03M 1/1085 |
| 2008/0143563 A1* | 6/2008 | Suyama | .............. | H03M 1/0836 |
| | | | | 341/120 |
| 2009/0066552 A1* | 3/2009 | Quinn | ................. | H03M 1/0614 |
| | | | | 341/150 |
| 2010/0225517 A1* | 9/2010 | Aiba | ..................... | H03M 3/372 |
| | | | | 341/143 |
| 2011/0102215 A1* | 5/2011 | Bauer | ................. | H03M 1/0614 |
| | | | | 341/118 |
| 2011/0285566 A1 | 11/2011 | Goto | | |
| 2014/0062736 A1* | 3/2014 | Nandi | ................. | H03M 1/0675 |
| | | | | 341/110 |
| 2014/0266119 A1* | 9/2014 | Burton | .................. | H02M 3/157 |
| | | | | 323/283 |
| 2015/0256191 A1* | 9/2015 | Yamamoto | .............. | H03M 1/12 |
| | | | | 341/120 |
| 2015/0263743 A1 | 9/2015 | Nakanishi | | |
| 2016/0322902 A1* | 11/2016 | Tsuruyama | ......... | H02M 3/1588 |

FOREIGN PATENT DOCUMENTS

| | | |
|---|---|---|
| JP | S61295722 A | 12/1986 |
| JP | H03276921 A | 12/1991 |
| JP | H0733032 U | 6/1995 |
| JP | 2000004161 A | 1/2000 |
| JP | 2013258543 A | 12/2013 |
| JP | 2014057245 A | 3/2014 |
| JP | 2014212433 A | 11/2014 |

OTHER PUBLICATIONS

International Preliminary Report on Patentability for International Patent Application No. PCT/JP2017/024327, issued by the International Bureau of WIPO dated Jan. 8, 2019.

* cited by examiner

DA CONVERTER, DA CONVERTING METHOD, ADJUSTING APPARATUS, AND ADJUSTING METHOD

The contents of the following Japanese patent application are incorporated herein by reference:

NO. 2016-133729 filed in JP on Jul. 5, 2016, and PCT/JP2017/024327 filed on Jul. 3, 2017.

BACKGROUND

1. Technical Field

The present invention relates to a DA converter, a DA converting method, an adjusting apparatus, and an adjusting method.

2. Related Art

Conventionally, in DA converters to convert digital signals into analog signals, circuits to reduce odd-order harmonic distortion are known (refer to Patent document 1, for example).

Patent document 1: WO 2015/025504

Ideally, even-order harmonic distortion is not generated for DA converters, but in reality, even-order (especially second-order) harmonic distortion may be generated in its design and/or manufacturing such as mismatches in the layout. Such second-order harmonic distortion has been often smaller than that of odd-order harmonic distortion, however, by using circuits to precisely reduce the odd-order harmonic distortion, the magnitude of second-order harmonic distortion has become approximately the same as that of the odd-order harmonic distortion or greater. Accordingly, it has been desired that such second-order harmonic distortion is more precisely reduced with convenient configurations.

[General Disclosure]

The first aspect in the present invention provides a DA converter including: a DA converting unit to input reference voltage and a digital value and output an analog signal according to the digital value based on the reference voltage; and a superimposing unit to superimpose, on the reference voltage, a superimposing signal based on the analog signal that is output from the DA converting unit, and a DA converting method.

(Item 1) A DA converter may include a DA converting unit to input reference voltage and a digital value and output an analog signal according to the digital value based on the reference voltage.

The DA converter may include a superimposing unit to superimpose, on the reference voltage, a superimposing signal based on the analog signal output from the DA converting unit.

(Item 2) The DA converter may further include a setting input unit to input a setting regarding at least one of a superimposing amount and a sign of an analog signal to be included in the superimposing signal.

The superimposing unit may adjust an analog signal according to the setting input from the setting input unit and includes the resultant adjusted analog signal in the superimposing signal.

(Item 3) The superimposing unit may have a resistance connected between the output of the DA converting unit and the reference voltage.

(Item 4) The resistance may have a resistance value that is greater than the output impedance of the DA converting unit.

(Item 5) The resistance may be a variable resistance, a resistance value of the variable resistance being set according to the setting input from the setting input unit.

(Item 6) The DA converter may further have a capacitor, one end of the capacitor being connected between the reference voltage and the resistance, and the other end of the capacitor being connected to reference voltage that is different from the reference voltage.

(Item 7) The DA converting unit may have a differential DA converter to output a positive-side analog signal and a negative-side analog signal.

The superimposing unit may have a switch to switch, according to the setting input from the setting input unit, which superimposing signal is superimposed on the reference voltage between the superimposing signal based on the positive-side analog signal and the superimposing signal based on the negative-side analog signal.

(Item 8) When a superimposing signal based on one of the positive-side analog signal and the negative-side analog signal is superimposed on the reference voltage, the superimposing unit may adjust the impedance of the signal line to output the other of the positive-side analog signal and the negative-side analog signal.

(Item 9) The DA converter may further include reference voltage that is input to the DA converter.

The DA converter may further include a decoupling unit to decouple between the reference voltage input to the DA converter and the reference voltage input to at least one other circuit that shares the power source with the DA converter.

(Item 10) A DA converter may include a DA converting unit to input reference voltage and a digital value and output an analog signal according to the digital value based on the reference voltage.

The DA converter may include a superimposing unit to superimpose, on the reference voltage, a superimposing signal to reduce harmonic distortion in the DA converting unit.

(Item 11) The superimposing unit may superimpose, on the reference voltage, a superimposing signal that changes according to change in the digital value.

(Item 12) The superimposing unit may superimpose, on the reference voltage, a superimposing signal based on the analog signal output from the DA converting unit.

(Item 13) The DA converter may further include a setting input unit to input a setting regarding at least one of the magnitude and the sign of the superimposing signal.

The superimposing unit may superimpose, on the reference voltage, a superimposing signal according to the setting input from the setting input unit.

(Item 14) A DA converting method may include inputting reference voltage and a digital value, and outputting an analog signal according to the digital value based on the reference voltage.

The DA converting method may include superimposing, on the reference voltage, a superimposing signal based on the analog signal.

(Item 15) The DA converting method may include inputting reference voltage and digital value, and outputting, from the DA converting unit, an analog signal according to the digital value based on the reference voltage.

The DA converting method may include superimposing, on the reference voltage, a superimposing signal to reduce harmonic distortion in the DA converting unit.

(Item 16) An adjusting apparatus may adjust the DA converter according to any of Items 2 to 9 and 13.

The adjusting apparatus may include a supplying unit to supply a digital waveform to the DA converter.

The adjusting apparatus may include a measuring unit to measure an analog waveform that is output from the DA converter according to the digital waveform.

The adjusting apparatus may include a detecting unit to detect harmonic distortion included in the measured analog waveform.

The adjusting apparatus may include a setting processing unit to supply a setting to reduce the detected harmonic distortion to the setting input unit of the DA converter.

(Item 17) An adjusting method may adjust the DA converter according to any of Items 2 to 9, and 13.

The adjusting method may include supplying a digital waveform to the DA converter.

The adjusting method may include measuring an analog waveform that is output from the DA converter according to the digital waveform.

The adjusting method may include detecting harmonic distortion included in the measured analog waveform.

The adjusting method may include supplying a setting to reduce the detected harmonic distortion to the setting input unit of the DA converter.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
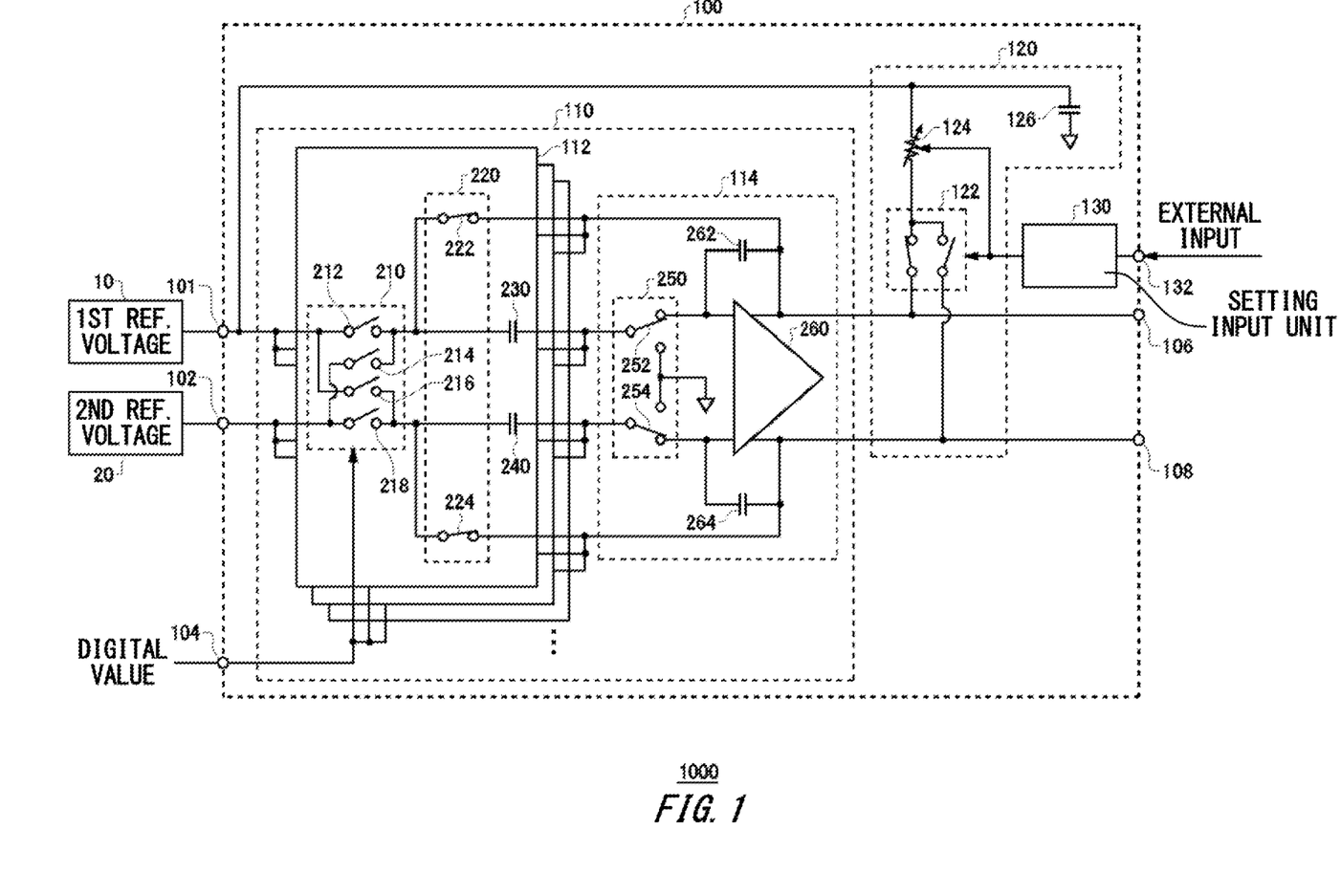
FIG. 1 shows an exemplary configuration of a DA converting system 1000 according to the present embodiment.

FIG. 1 shows an exemplary configuration of a DA converting system 1000 according to the present embodiment. The DA converting system 1000 includes a first reference voltage 10, a second reference voltage 20, and a DA converter 100. The first reference voltage 10 and the second reference voltage 20 each supply reference voltages to the DA converter 100. The first reference voltage 10 and the second reference voltage 20 are, as one example, a power supply apparatus to output the reference voltages. Also, the first reference voltage 10 and the second reference voltage 20 may be an integrated power supply apparatus or power source circuit. Here, one of the first reference voltage 10 and the second reference voltage 20 outputs digital signals of HIGH voltage, whereas the other of them outputs digital signals of LOW voltage. In the present embodiment, an example where the first reference voltage outputs the HIGH voltage, whereas the second reference voltage outputs the LOW voltage is described.

The DA converter 100 converts an input digital value into a corresponding analog signal and outputs the resultant converted analog signal. The DA converter 100 superimposes part of the resultant converted analog signal on the reference voltage to reduce second-harmonic distortion. The DA converter 100 includes a first input terminal 101, a second input terminal 102, a digital input terminal 104, a first output terminal 106, a second output terminal 108, a DA converting unit 110, a superimposing unit 120, and a setting input unit 130.

The first input terminal 101 inputs reference voltage supplied from the first reference voltage 10 (HIGH voltage, in the present example). The second input terminal 102 inputs reference voltage supplied from the second reference voltage 20 (LOW voltage, in the present example). The digital input terminal 104 inputs a digital value of the digital signal. The first output terminal 106 and the second output terminal 108 each output analog signals converted by the DA converter 100 according to the reference voltages and the digital value. The first output terminal 106 and the second output terminal 108 may each output analog signals having polarities that are different from each other. In the present embodiment, an example where the first output terminal 106 outputs a positive side analog signal and the second output terminal 108 outputs a negative side analog signal is described.

The DA converting unit 110 inputs reference voltages and the digital value and outputs the analog signal according to the digital value based on the reference voltage. The DA converting unit 110 switches and performs, every half phase, two operations: sampling (sampling phase) and charge transfer (integral phase). The DA converting unit 110 has an input unit 112 and a differential DA converter 114.

The input unit 112 performs sampling the input reference voltage according to the digital value. The DA converting unit 110 may have one or more input units 112 provided. Each input unit 112 includes a first switching unit 210, a second switching unit 220, a first capacitor 230, and a second capacitor 240.

In the sampling phase, the first switching unit 210 connects the first capacitor 230, according to the digital value, to either the first reference voltage 10 or the second reference voltage 20. Also, in the sampling phase, the first switching unit 210 connects the second capacitor 240, according to the digital value, to the other one of the first reference voltage 10 and the second reference voltage 20 that is not connected to the first capacitor 230. Also, in the integral phase, the first switching unit 210 cuts off respective electrical connections between both the first reference voltage 10 and the second reference voltage 20 and both the first capacitor 230 and the second capacitor 240. The first switching unit 210 includes a first switch 212, a second switch 214, a third switch 216, and a fourth switch 218.

In the integral phase, the first switch 212 through the fourth switch 218 are set to OFF state where the electrical connections are cut off. Also, in the sampling phase, the first switch 212 through the fourth switch 218 switch the electrical connections as follows.

The first switch 212 supplies, according to the digital value, the reference voltage from the first reference voltage 10 to the first capacitor 230. Also, the second switch 214 supplies, according to the digital value, the reference voltage from the second reference voltage 20 to the first capacitor 230. When the first switch 212 supplies the reference voltage from the first reference voltage 10 to the first capacitor 230, the second switch 214 cuts off the electrical connection between the second reference voltage 20 and the first capacitor 230. Also, when the second switch 214 supplies the reference voltage from the second reference voltage 20 to the first capacitor 230, the first switch 212 cuts off the electrical connection between the first reference voltage 10 and the first capacitor 230.

The third switch 216 supplies, according to the digital value, the reference voltage from the first reference voltage 10 to the second capacitor 240. Also, the fourth switch 218 supplies, according to the digital value, the reference voltage from the second reference voltage 20 to the second capacitor 240.

When the third switch 216 supplies the reference voltage from the first reference voltage 10 to the second capacitor 240, the fourth switch 218 cuts off the electrical connection between the second reference voltage 20 and the second capacitor 240, and also, the second switch 214 supplies the reference voltage from the second reference voltage 20 to the first capacitor 230. Also, when the fourth switch 218 supplies the reference voltage from the second reference voltage 20 to the second capacitor 240, the third switch 216 cuts off the electrical connection between the first reference voltage 10 and the second capacitor 240, and also, the first switch 212 supplies the reference voltage from the first reference voltage 10 to the first capacitor 230.

In the integral phase, the second switching unit 220 connects the first capacitor 230 and the second capacitor 240 to the first output terminal 106 and the second output terminal 108, respectively. Also, in the sampling phase, the second switching unit 220 cuts off electrical connections between the first capacitor 230 and the second capacitor 240, and the first output terminal 106 and the second output terminal 108, respectively. The second switching unit 220 includes a fifth switch 222 and a sixth switch 224.

In the integral phase, the fifth switch 222 connects one end of the first capacitor 230 to the first output terminal 106, whereas, in the sampling phase, the fifth switch 222 cuts off the electrical connection between the one end of the first capacitor 230 and the first output terminal 106. Also, in the integral phase, the sixth switch 224 connects one end of the second capacitor 240 to the second output terminal 108, whereas, in the sampling phase, the sixth switch 224 cuts off the electrical connection between the one end of the second capacitor 240 and the second output terminal 108.

In the sampling phase, the first capacitor 230 and the second capacitor 240 perform sampling on the first reference voltage or the second reference voltage. Also, in the integral phase following the sampling phase, the first capacitor 230 and the second capacitor 240 transfer electric charges that are charged in the sampling phase to the differential DA converter 114.

Note that, when a plurality of the input units 112 are provided to the DA converting unit 110, the other ends of the plurality of the fifth switches 222 respectively included in the plurality of the input units 112 are electrically connected to each other. Also, the other ends of a plurality of the sixth switches 224 respectively included in the plurality of the input units 112 are electrically connected to each other. Similarly, the other ends of a plurality of the first capacitors 230 are electrically connected to each other. The other ends of a plurality of the second capacitors 240 are electrically connected to each other. The other ends of the plurality of the fifth switches 222, the other ends of the plurality of the sixth switches 224, the other ends of the plurality of the first capacitors 230, and the other ends of the plurality of the second capacitors 240 which are each electrically connected to each other are each connected to the differential DA converter 114.

The differential DA converter 114 outputs, based on the input from the input unit 112, a positive-side analog signal and a negative-side analog signal. The differential DA converter 114 includes a third switching unit 250, an amplifier 260, a third capacitor 262, and a fourth capacitor 264.

The third switching unit 250 switches connection of the first capacitor 230 and the second capacitor 240 either to the third reference voltage or the feedback capacitors of the amplifier 260. Here, the third reference voltage may be predetermined voltage, for example, common voltage and/or 0 V (ground voltage: GND). The third switching unit 250 includes a seventh switch 252 and an eighth switch 254.

In the sampling phase, the seventh switch 252 connects the other end of the first capacitor 230 to the third reference voltage, whereas, in the integral phase, the seventh switch 252 connects the other end of the first capacitor 230 to the third capacitor 262. Also, in the sampling phase, the eighth switch 254 connects the other end of the second capacitor 240 to the third reference voltage, whereas, in the integral phase, the eighth switch 254 connects the other end of the second capacitor 240 to the fourth capacitor 264.

The amplifier 260 amplifies the input signal to output the resultant amplified signal. FIG. 1 shows an example where the amplifier 260 is a differential amplifier. The amplifier 260 amplifies a positive-side input signal from one input and outputs the resultant amplified signal, as a positive-side analog signal, from one output, and amplifies a negative-side input signal from the other input and outputs the resultant amplified signal, as a negative-side analog signal, from the other output. FIG. 1 shows an example where one of inputs of the first capacitor 230 and the amplifier 260 are connected, and the other inputs of the second capacitor 240 and the amplifier 260 are connected to each other.

The third capacitor 262 is provided between one input and one output of the amplifier 260. The fourth capacitor 264 is provided between the other input and the other output of the amplifier 260. The third capacitor 262 and the fourth capacitor 264 operate as feedback capacitors of the amplifier 260.

In the sampling phase, the DA converting unit 110 described above charges electric charges to the first capacitor 230 according to the first reference voltage or the second reference voltage, by the first switch 212 or the second switch 214 being switched into ON state, and the seventh switch 252 connecting the first capacitor 230 and the third reference voltage. Also, in the integral phase, in the DA converting unit 110, the first switch 212 and the second switch 214 are switched into OFF state, and, by the seventh switch 252 connecting the first capacitor 230 and the third capacitor 262, the electric charges that are charged in the first capacitor 230 in the sampling phase are transferred to the third capacitor 262.

Also, in the sampling phase, the DA converting unit 110 charges electric charges to the second capacitor 240 according to the first reference voltage or the second reference voltage, by the third switch 216 or the fourth switch 218 being switched into ON state, and the eighth switch 254 connecting the second capacitor 240 and the third reference voltage. Also, in the integral phase, in the DA converting unit 110, the third switch 216 and the fourth switch 218 are switched into OFF state, and, by the eighth switch 254 connecting the second capacitor 240 and the fourth capacitor 264, the electric charges that are charged in the second capacitor 240 in the sampling phase are transferred to the fourth capacitor 264.

As described above, the DA converting unit 110 performs, in the sampling phase, DA conversion on the digital signal by sampling the first reference voltage and the second reference voltage according to the digital value using the first capacitor 230 and the second capacitor 240. Then, in the integral phase, by transferring the electric charges that are charged in the first capacitor 230 and the second capacitor 240 in the sampling phase to the third capacitor 262 and the fourth capacitor 264, analog signals according to the digital value are output.

Ideally, even-order harmonic distortion is not generated for such DA converting unit 110, and thus, by reducing odd-order harmonic distortion, digital-analog conversion can be performed accurately. However, in reality, even-order harmonic distortion is generated, when forming the DA converting unit 110, due to mismatches in the circuit layout, etc., and thus, only reducing odd-order harmonic distortion has not been enough for the conversion accuracy, in some cases. Here, the DA converter 100 in the present embodiment includes a superimposing unit 120 and a setting input unit 130 to reduce second-order harmonic distortion in the DA converting unit 110.

The superimposing unit 120 superimposes, on the reference voltage, a superimposing signal based on the analog signal output from the DA converting unit 110. The superimposing unit 120 superimposes, on the reference voltage, a superimposing signal to reduce harmonic distortion in the DA converting unit 110. The superimposing unit 120 superimposes, on the reference voltage, a superimposing signal that changes according to change in the digital value. The superimposing unit 120 may superimpose a superimposing signal on one of the reference voltages output from the first reference voltage 10 and the second reference voltage 20. FIG. 1 shows an example where the superimposing unit 120 superimposes the superimposing signal on the reference voltage output from the first reference voltage 10. Also, the superimposing unit 120 may generate a superimposing signal based on either the positive-side analog signal or the negative-side analog signal. The superimposing unit 120 has a switch 122, a resistance 124, and a capacitor 126.

The switch 122 switches which superimposing signal is superimposed on the reference voltage between the superimposing signal based on the positive-side analog signal and the superimposing signal based on the negative-side analog signal. According to the setting input to control switching, the switch 122 connects, via the resistance 124, either the first output terminal 106 or the second output terminal 108 to the first reference voltage 10.

For example, according to one setting input, the switch 122 connects one output of the amplifier 260 to one end of the resistance 124 and, according to the one setting input, cuts off the connection between the other output of the amplifier 260 and one end of the resistance 124. In this case, according to another setting input, the switch 122 cuts off the connection between one output of the amplifier 260 and one end of the resistance 124 and, according to the other setting input, connects the other output of the amplifier 260 to one end of the resistance 124.

The resistance 124 is connected between output of the DA converting unit 110 and the first reference voltage 10. The resistance 124 may be a variable resistance. The resistance 124 is, as one example, a variable resistance whose resistance value is varied according to the setting input. The resistance 124 may have a resistance value that is greater than an output impedance of the DA converting unit 110. The resistance 124 may have a resistance value that is ten times, or preferably one hundred times greater than the output impedance. For example, when the output impedance of the DA converting unit 110 is approximately 100Ω, the resistance 124 preferably has a resistance value of approximately several tens kΩ.

That is, the resistance 124 connects the first reference voltage 10 and the first output terminal 106, and has a resistance value such that an effect of the reference voltage can be ignored on the output voltage from the first output terminal 106. Thereby, while preventing noise components, etc. from superimposing on the output from the DA converting unit 110, the superimposing unit 120 can superimpose the superimposing signal on the reference voltage.

The capacitor 126 is provided between the other end of the resistance 124 and the third reference voltage. That is, one end of the capacitor 126 is connected between the first reference voltage 10 and the resistance 124, and, the other end of the capacitor 126 is connected to the third reference voltage that is different from the first reference voltage. The capacitor 126, according to a combination with the resistance 124, functions as an RC low-pass filter. That is, the superimposing unit 120 superimposes a signal obtained by filtering an analog signal by the resistance 124 and the capacitor 126, as the superimposing signal, on the reference voltage.

The setting input unit 130 inputs a setting regarding at least one of the magnitude and the sign of the superimposing signal. The setting input unit 130 inputs a setting regarding at least one of the superimposing amount and the sign of the analog signal to include in the superimposing signal. The setting input unit 130 has an external input terminal 132 and supplies, to the superimposing unit 120, a setting signal to set at least one of the superimposing amount and the sign according to an external input that is input from the external input terminal 132. The setting input unit 130 may supply, to the superimposing unit 120, the setting signal to set the connection of the switch 122. Thereby, the switch 122 switches, according to the setting input from the setting input unit 130, which superimposing signal is superimposed on the reference voltage between the superimposing signal based on the positive-side analog signal and superimposing signal based on the negative-side analog signal.

Also, the setting input unit 130 supplies, to the superimposing unit 120, a setting signal to set the connection of the resistance 124. Thereby, the resistance value of the resistance 124 is set according to the setting input from the setting input unit 130. Accordingly, the superimposing unit 120 adjusts an analog signal according to the setting input from the setting input unit 130 and includes the resultant adjusted analog signal in the superimposing signal. A superimposing signal for the superimposing unit 120 to superimpose on the reference voltage is described next.

Figure 2:
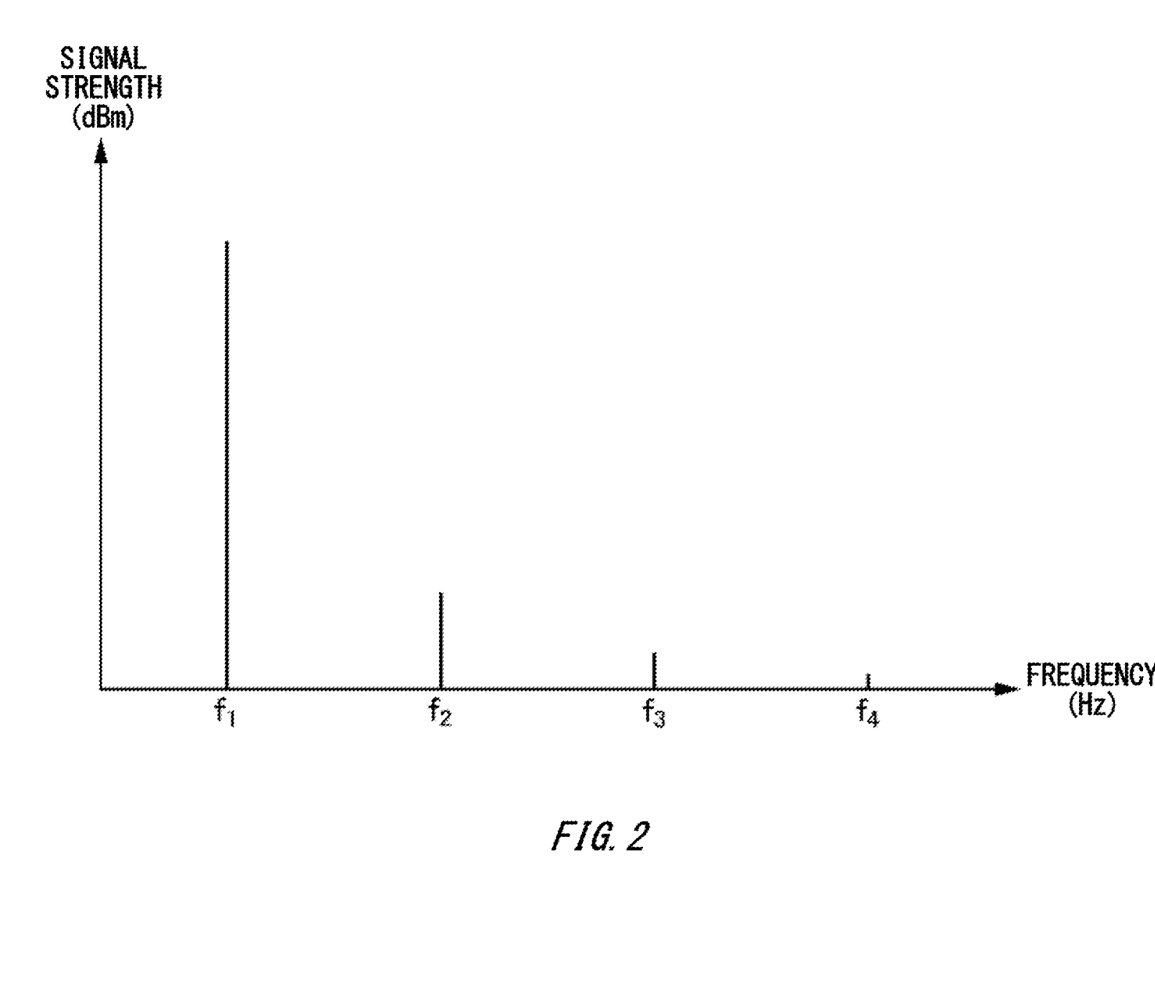
FIG. 2 shows an exemplary frequency characteristic of an output signal of the DA converting unit 110 according to the present embodiment.

FIG. 2 shows an exemplary frequency characteristic of an output signal of the DA converting unit 110 according to the present embodiment. FIG. 2 shows an exemplary output of the DA converting unit 110 when there is no superimposition by the superimposing signal from the superimposing unit 120. Also, FIG. 2 shows exemplary output when a digital value that changes periodically at frequency $f_1$ is input to the DA converting unit 110.

Accordingly, ideally, the DA converting unit 110 outputs an analog periodic signal of frequency $f_1$. However, the DA converting unit 110 generates and outputs harmonic component such as a second-harmonic component $f_2$ of twice the frequency a third-harmonic component $f_3$ of three times the frequency $f_1$, and a fourth-harmonic component $f_4$ of four times the frequency Here, the even-order harmonic component $f_2, f_4, \ldots$ are components that is output from the DA converting unit 110, according to the digital input of the frequency $f_1$ due to mismatches in the circuit layout, etc. That is, when a signal having approximately the same frequency as the frequency $f_1$ and also having a different phase is input to the DA converting unit 110, the DA converting unit 110 generates even-order harmonic components that are different in the phase. Also, when the component of the frequency $f_1$ are superimposed on the reference voltage input to the DA converting unit 110, similarly, even-order harmonic components are generated.

Accordingly, by superimposing signal components of a basic wave on the digital input or the reference voltage to generate harmonic component, the even-order harmonic component generated due to mismatches in the circuit layout, etc. can be cancelled out and reduced. Note that, among even-order harmonic components, second-harmonic component $f_2$ is the main component, and thus the DA converter 100 in the present embodiment shows an example to reduce the second-harmonic component $f_2$ and output the analog signal accurately. That is, the DA converter 100 according to the present embodiment superimposes, on the reference voltage, components of the basic frequency $f_1$ among the analog outputs of the DA converting unit 110, and reduces the second-harmonic component $f_2$. Thereby, the DA converter 100 can reduce the even-order harmonic component without providing additional circuits, etc. for the digital signal input.

In this case, the superimposing unit 120 removes the harmonic components $f_2, f_3, f_4, \ldots$ of the analog output of the DA converting unit 110 by a filter obtained by combination of the capacitor 126 and the resistance 124, and extracts the basic wave component $f_1$ as the superimposing signal. Note that the harmonic component that is output from the DA converting unit 110 is at a level of signal strength lower than that of the basic wave component by a several tens-one hundred dB or more, and thus the characteristic of the filter may be a first-order attenuation characteristic. Also, the superimposing unit 120 may provide resistances and capacitors so that the characteristic of the filter has a higher-order characteristic.

When the superimposing unit 120 superimposes the basic wave component $f_1$, as the superimposing signal, on the reference voltage of the first reference voltage 10 (HIGH voltage), the positive-side analog signal $N_{OUT}$ of the DA converting unit 110 can be expressed by the following expression. Here, the digital value to input is denoted by Data (dig); the reference voltage of HIGH voltage is denoted by $V_{REFH}$; the reference voltage of LOW voltage is denoted by $V_{REFL}$; the attenuation amount by filtering is denoted by k; and $\omega=2\pi f_1$. Note that it is assumed that the digital value Data (dig) satisfies the relationship: $\sin(\omega t)$, and for the positive-side analog signal $N_{OUT}$, a component in-phase with that of the input is output.

$$N_{OUT} = \text{Data(dig)} \cdot (V_{REFH} + k \cdot \sin(\omega t) \cdot V_{REFL}) \quad \text{(Expression 1)}$$
$$= \sin(\omega t) \cdot (V_{REFH} \cdot V_{REFL} + k \cdot \sin(\omega t))$$

In this case, the negative-side analog signal $P_{OUT}$ is inverted in phase, which can be expressed by the following expression.

$$P_{OUT} = -\sin(\omega t) \cdot (V_{REFH} - V_{REFL} + k \cdot \sin(\omega t))$$

Accordingly, the differential signal output of the DA converting unit 110 can be expressed by the following expression.

$$N_{OUT} \cdot P_{OUT} = \sin(\omega t) \cdot (V_{REFH} \cdot V_{REFL} + k \cdot \sin(\omega t)) \cdot \quad \text{(Expression 3)}$$
$$\{ \cdot \sin(\omega t) \cdot (V_{REFH} \cdot V_{REFL} + k \cdot \sin(\omega t)) \}$$
$$= 2\sin(\omega t) \cdot (V_{REFH} \cdot V_{REFL}) + 2k \cdot \{\sin(\omega t)\}^2$$
$$= 2\sin(\omega t) \cdot (V_{REFH} \cdot V_{REFL}) + k \cdot \cos(2\omega t)$$

Here, when using no superimposing unit 120, the ideal differential signal output of the DA converting unit 110 satisfies the relationship: $2 \sin(\omega t) \cdot (V_{REFH} - V_{REFL})$, and thus the superimposing unit 120 superimposes a component of $k \cdot \cos(2\omega t)$ on the differential signal output. That is, is can be seen that by superimposing the first-order basic wave component, on the reference voltage, the superimposing unit 120 can superimpose the second-harmonic component on the output of the DA converting unit 110.

Note that an example where the superimposing unit 120 generates superimposing signals using the positive-side analog signal $N_{OUT}$ of the DA converting unit 110 has been described, but, by the switch 122 being switched, superimposing signals may be generated using the negative-side analog signal $P_{OUT}$. In this case, the positive-side analog signal $N_{OUT}$ is inverted in phase, and thus the second-harmonic component that is superimposed on the output of the DA converting unit 110 is inverted in polarity to satisfy $-k \cdot \cos(2\omega t)$. Accordingly, the superimposing unit 120 can reduce the second-harmonic component of the output of the DA converting unit 110 by the value of the resistance 124 being set according to the magnitude of the absolute value of the second harmonic to reduce and the switch of the switch 122 being set according to the polarity of the second harmonic to reduce.

As described above, the DA converter 100 according to the present embodiment can reduce the second-harmonic component of the output of the DA converting unit 110 using the convenient configuration. Note that FIG. 1 shows an example where the DA converting unit 110 has the differential DA converter 114 and outputs a differential analog signal, but it is not limited to this. Alternatively, the DA converting unit 110 may have a single-ended DA converter and output a single-ended analog signal. In this case, the superimposing unit 120 can reduce the second-harmonic component, by superimposing single-ended analog signal outputs. Also, FIG. 1 shows an example, but not limited to this, where the superimposing unit 120 superimposes the superimposing signal on the reference signal of HIGH voltage and alternatively, the superimposing unit 120 may superimpose the superimposing signal on the reference signal of LOW voltage.

Figure 3:
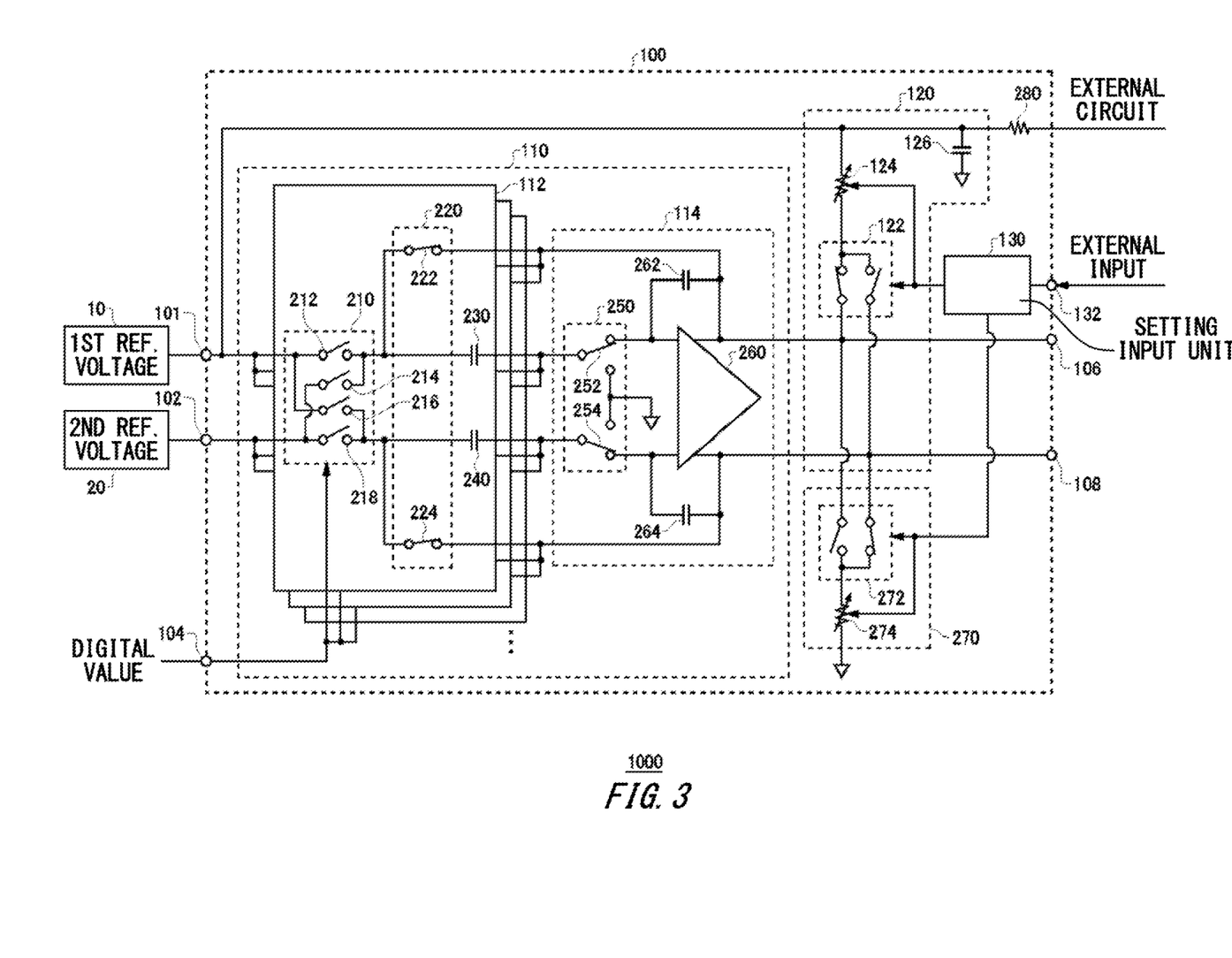
FIG. 3 shows a modification of the DA converting system 1000 according to the present embodiment.

FIG. 3 shows a modification of the DA converting system 1000 according to the present embodiment. In the DA converting system 1000 in the present modification, operations approximately the same as those of the DA converting system 1000 according to the present embodiment shown in FIG. 1 are given the same reference numerals, and the description thereof will not be repeated. In the DA converting system 1000 in the present modification, the DA converter 100 further includes an adjusting unit 270 and a decoupling unit 280.

The adjusting unit 270 adjusts an impedance of a signal line of either the positive-side analog signal or the negative-side analog signal. The adjusting unit 270 has a signal line switch 272 and a resistance 274.

The signal line switch 272 connects either one output or the other output of the amplifier 260 to one end of the resistance 274. The signal line switch 272 connects the output on a side different from the output of the amplifier 260 on a side where the switch 122 is connected to the one end of the resistance 124, to one end of the resistance 274. For example, according to one setting input, the signal line switch 272 connects the other output of the amplifier 260 to one end of the resistance 274, and, according to the other setting input, connects one output of the amplifier 260 to one end of the resistance 274.

The resistance 274 is connected between output of the DA converting unit 110 and the third reference voltage. The resistance 274 may be a variable resistance. The resistance 274, as one example, a variable resistance whose resistance value is varied according to a setting input. The resistance 274 may have a resistance value that is approximately the same as the resistance value of the resistance 124. Also, the resistance 274 may be set so as to have approximately the same resistance value as the resistance value of the resistance 124.

The adjusting unit 270 described above adjusts the impedance by connecting the output of the amplifier 260 to which the signal line switch 272 is connected to the third reference voltage via resistance 274. Note that the adjusting unit 270 may be provided to the superimposing unit 120. That is, the superimposing unit 120 selects the output of the amplifier 260 for the adjusting unit 270 to adjust the impedance according to switch of the switch 122. The superimposing unit 120 adjusts, for example, the impedance of the output different from the output of the amplifier 260 to which the switch 122 is connected.

In this manner, when a superimposing signal based on one of the positive-side analog signal and the negative-side analog signal is superimposed on the reference voltage, the superimposing unit 120 adjusts the impedance of the signal line to output the other signal of the positive-side analog signal and negative-side analog signal. Thereby, the superimposing unit 120 can adjust the impedances of the two signal lines to transmit the positive-side analog signal and the negative-side analog signal so as to be approximately the same, and prevent, by balancing the signal transmission, disturbance of the signal waveform, etc.

The decoupling unit 280 decouples between the reference voltage input to the DA converter 100 and the reference voltage input to at least one other circuit that shares the power source with the DA converter 100. The decoupling unit 280 may include a resistance having a resistance value that is approximately the same as the resistance 124 of the superimposing unit 120 or greater. The decoupling unit 280 is connected between the reference voltage on which the superimposing unit 120 superimposes the superimposing signal and other circuits, etc. that are connected to the reference voltage. Thereby, while superimposing the superimposing signal on the reference voltage, the DA converter 100 can prevent the superimposing signal from transmitting to other external circuits, etc. that are connected to the first reference voltage 10.

As described above, the DA converter 100 according to the present embodiment, as well as reduce the second harmonic according to the setting, can adjust imbalance of the output signal lines. Also, the DA converter 100 can prevent the superimposing signal from being leaked to the outside. An adjusting apparatus that easily sets such DA converter 100 and appropriately reduces the second harmonic is described next.

Figure 4:
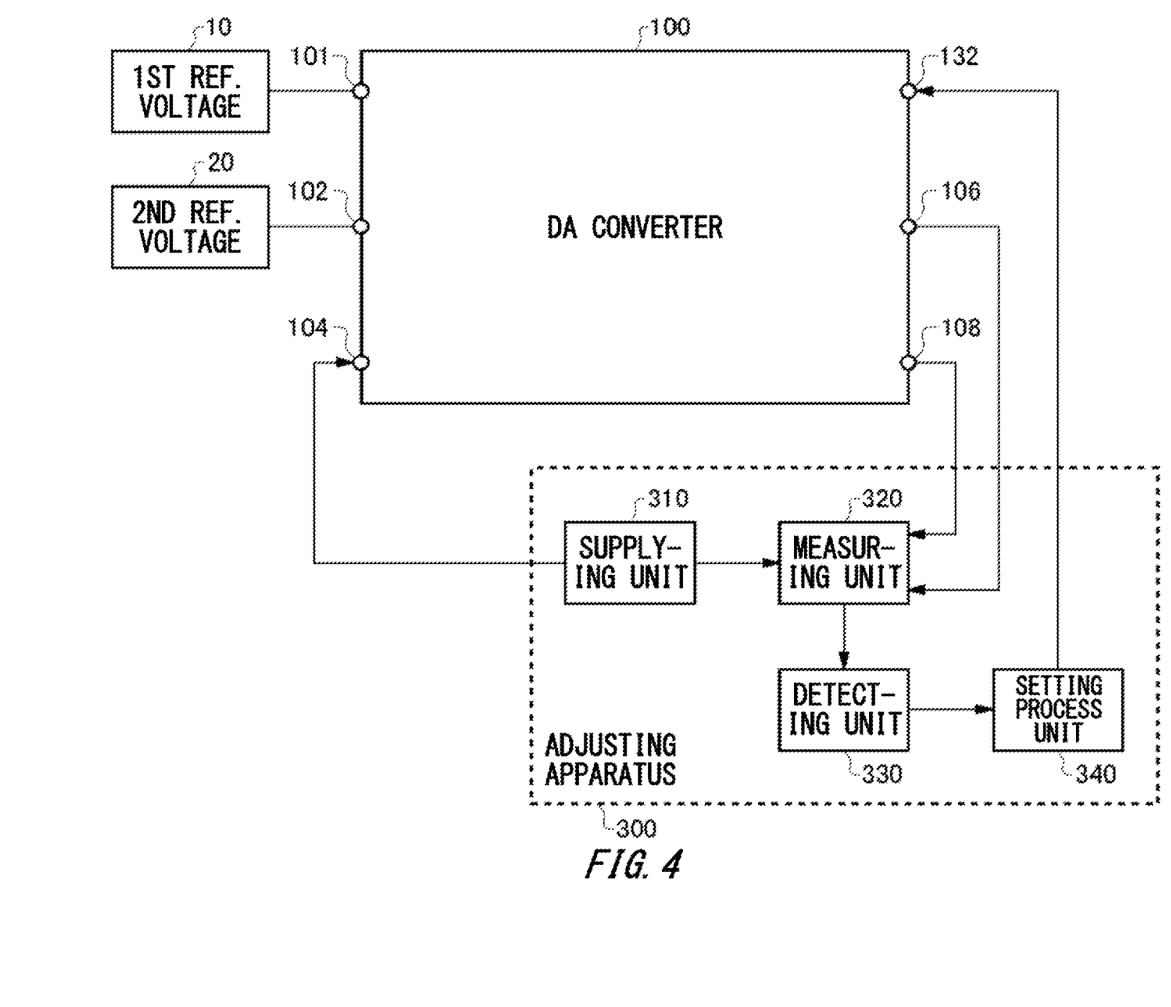
FIG. 4 shows an exemplary configuration of an adjusting apparatus 300 according to the present embodiment, together with the DA converting system 1000.

FIG. 4 shows an exemplary configuration of an adjusting apparatus 300 according to the present embodiment, together with the DA converting system 1000. The adjusting apparatus 300 adjusts the DA converter 100. The adjusting apparatus 300 may adjust the DA converter 100 and determine an appropriate setting value for the DA converter 100. The adjusting apparatus 300 includes a supplying unit 310, a measuring unit 320, a detecting unit 330, and a setting processing unit 340.

The supplying unit 310 supplies digital waveforms to the DA converter 100. For example, the supplying unit 310 supplies digital values corresponding to sine wave signals having predetermined frequency. The supplying unit 310, as one example, supplies a digital value corresponding to the digital value Data (dig) in Expression 1 to the digital input terminal 104.

The measuring unit 320 measures an analog waveform that is output from the DA converter 100 according to the digital waveform. The measuring unit 320 acquires an analog output signal from the first output terminal 106 and the second output terminal 108. The measuring unit 320 may acquire the analog output signal, corresponding to timing when the supplying unit 310 supplies the digital value to the DA converter 100. The measuring unit 320 supplies the acquired analog output signal to the detecting unit 330.

The detecting unit 330 detects harmonic distortion included in the measured analog waveform. The detecting unit 330 may perform frequency conversion on the acquired analog signal to detect the harmonic distortion. The detecting unit 330, as one example, may detect harmonic distortion using the frequency characteristic of the output signal as shown in FIG. 2. Alternatively, the detecting unit 330 may extract the predetermined frequency component from the acquired analog signal to detect harmonic distortion. The detecting unit 330, as one example, extracts frequency component of twice the frequency of the sine wave signal supplied by the supplying unit 310 by filters or the like to detect second-harmonic distortion. The detecting unit 330 supplies the detected result to the setting processing unit 340.

The setting processing unit 340 supplies a setting to reduce the detected harmonic distortion to the setting input unit 130 of the DA converter 100. The setting processing unit 340 may set the switch 122 by switching the connection of the switch 122 and adopting either one of the connections so as to reduce the harmonic distortion and. The switch 122 switches the polarity of the superimposing signal, and thus, when the second harmonic of the DA converter 100 and the second harmonic generated by the superimposing signal have the same polarities, the harmonic distortion increases and, when they have opposite polarities, the harmonic distortion decreases. Accordingly, the setting processing unit 340 can easily set the connection of the switch 122 based on increase and decrease in the magnitude of the harmonic distortion.

Also, the setting processing unit 340 may adjust the magnitude of the resistance 124 so as to reduce the magnitude of the harmonic distortion. The resistance value of the resistance 124 increases and decreases the absolute value of the superimposing signal, and thus the setting processing unit 340 can easily set the resistance value of the resistance 124 based on the magnitude of the harmonic distortion. The setting processing unit 340 sets, as one example, the resistance value of the resistance 124 such that the harmonic distortion is the smallest. As described above, the adjusting apparatus 300 according to the present embodiment, by supplying a digital periodic signal to the DA converter 100 so that the DA converter 100 detects the converted analog periodic signal, can adjust and appropriately set the DA converter 100.

Various embodiments of the present invention described above may be described with reference to flow charts and block diagrams. The blocks in the flow charts and block diagrams may be represented as (1) steps of processes in which operations are performed or (2) "sections" of apparatuses responsible for performing operations. Certain steps and "sections" may be implemented by dedicated circuit, programmable circuit supplied with computer-readable instructions stored on computer-readable storage media, and/or processors supplied with computer-readable instructions stored on computer-readable storage media.

Note that dedicated circuit may include digital and/or analog hardware circuits and may include integrated circuits (IC) and/or discrete circuits. Programmable circuit may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc., for example.

Computer-readable storage media may include any tangible device that can store instructions for execution by a suitable device. Thereby, the computer-readable storage medium having instructions stored in the tangible device comprises an article of manufacture including instructions which can be executed to create means for performing operations specified in the flow charts or block diagrams.

Examples of computer-readable storage media may include an electronic storage medium, a magnetic storage medium, an optical storage medium, an electromagnetic storage medium, a semiconductor storage medium, etc. More specific examples of computer-readable storage media may include a floppy disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY® disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, etc. Also the computer-readable instructions may include source code or object code written in any combination of one or more programming languages, including an object oriented programming language such as Smalltalk, JAVA, C++, etc., and conventional procedural programming languages, such as the "C" programming language or similar programming languages.

Computer-readable instructions may be provided to a processor of a general purpose computer, special purpose computer, or other programmable data processing apparatus, or to programmable circuit, locally or via a local area network (LAN), wide area network (WAN) such as the Internet, etc. Thereby, a processor of a general purpose computer, special purpose computer, or other programmable data processing apparatus, or a programmable circuit can execute the computer-readable instructions to create means for performing operations specified in the flow charts or block diagrams. Note that, examples of processors include computer processors, processing units, microprocessors, digital signal processors, controllers, microcontrollers, etc.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: First reference voltage; 20: Second reference voltage; 100: DA converter; 101: First input terminal; 102: Second input terminal; 104: Digital input terminal; 106: First output terminal; 108: Second output terminal; 110: DA converting unit; 112: Input unit; 114: Differential DA converter; 120: Superimposing unit; 122: Switch; 124: Resistance; 126: Capacitor; 130: Setting input unit; 132: External input terminal; 210: First switching unit; 212: First switch; 214: Second switch; 216: Third switch; 218: Fourth switch; 220: Second switching unit; 222: Fifth switch; 224: Sixth switch; 230: First capacitor; 240: Second capacitor; 250: Third switching unit; 252: Seventh switch; 254: Eighth switch; 260: Amplifier; 262: Third capacitor; 264: Fourth capacitor; 270: Adjusting unit; 272: Signal line switch; 274: Resistance; 280: Decoupling unit; 300: Adjusting apparatus; 310: Supplying unit; 320: Measuring unit; 330: Detecting unit; 340: setting processing unit; 1000: DA converting system

What is claimed is:

1. A DA converter comprising:
a DA converting unit to input a reference voltage and a digital value and output an analog signal according to the digital value based on the reference voltage; and
a superimposing unit to superimpose, on the reference voltage, a superimposing signal having a basic wave component of the analog signal.

2. The DA converter according to claim 1, further comprising a setting input unit to input a setting regarding at least one of a superimposing amount and a sign of the analog signal to include in the superimposing signal, wherein
the superimposing unit adjusts the analog signal according to a setting input from the setting input unit and includes a resultant adjusted analog signal in the superimposing signal.

3. The DA converter according to claim 2, wherein
the superimposing unit has a resistance that is connected between an output of the DA converting unit and the reference voltage.

4. The DA converter according to claim 3, wherein the resistance has a resistance value that is greater than an output impedance of the DA converting unit.

5. The DA converter according to claim 3, wherein the resistance is a variable resistance, a resistance value of the variable resistance being set according to a setting input from the setting input unit.

6. The DA converter according to claim 3, further having a capacitor, one end of the capacitor being connected between the reference voltage and the resistance and the other end of the capacitor being connected to a reference voltage that is different from the reference voltage.

7. The DA converter according to claim 3, wherein
the DA converting unit has a differential DA converter to output a positive-side analog signal and a negative-side analog signal, and
the superimposing unit has a switch to switch, according to a setting input from the setting input unit, which superimposing signal is superimposed on the reference voltage between the superimposing signal based on the positive-side analog signal and the superimposing signal based on the negative-side analog signal.

8. The DA converter according to claim 7, wherein
when the superimposing signal based on one of the positive-side analog signal and the negative-side analog signal is superimposed on the reference voltage, the superimposing unit adjusts an impedance of a signal line to output the other of the positive-side analog signal and the negative-side analog signal.

9. The DA converter according to claim 2, further comprising a decoupling unit to decouple between the reference voltage that is input to the DA converter and a reference voltage that is input to at least one other circuit that shares a power source with the DA converter.

10. The DA converter according to claim 1, wherein
the superimposing unit superimposes, on the reference voltage, the superimposing signal that changes according to change in the digital value.

11. The DA converter according to claim 1, wherein
the superimposing unit superimposes, on the reference voltage, a superimposing signal based on the analog signal output from the DA converting unit.

12. The DA converter according to claim 1, further comprising a setting input unit to input a setting regarding at least one of a magnitude and a sign of the superimposing signal, wherein
the superimposing unit superimposes, on the reference voltage, the superimposing signal according to a setting input from the setting input unit.

13. An adjusting apparatus to adjust the DA converter according to claim 12, comprising:
a supplying unit to supply a digital waveform to the DA converter;
a measuring unit to measure an analog waveform output from the DA converter according to the digital waveform;
a detecting unit to detect a harmonic distortion that is included in the analog waveform that is measured; and
a setting processing unit to supply a setting to reduce the harmonic distortion that is detected to the setting input unit of the DA converter.

14. An adjusting method to adjust the DA converter according to claim 2, comprising:
supplying a digital waveform to the DA converter;
measuring an analog waveform output from the DA converter according to the digital waveform;
detecting a harmonic distortion that is included in the analog waveform that is measured; and
supplying a setting to reduce the harmonic distortion that is detected to the setting input unit of the DA converter.

15. An adjusting method to adjust the DA converter according to claim 12, comprising:
supplying a digital waveform to the DA converter;
measuring an analog waveform output from the DA converter according to the digital waveform;
detecting a harmonic distortion that is included in the analog waveform that is measured; and
supplying a setting to reduce the harmonic distortion that is detected to the setting input unit of the DA converter.

16. The DA converter according to claim 1, wherein
the superimposing unit superimposes, on the reference voltage, the basic wave component of the analog signal as the superimposing signal.

17. The DA converter according to claim 1, wherein
the superimposing unit superimposes, on the reference voltage, a signal obtained by filtering the analog signal, as the superimposing signal.

18. A DA converting method comprising:
inputting a reference voltage and a digital value and outputting an analog signal according to the digital value based on the reference voltage;
passing the analog signal through a low-pass filter and generating a superimposing signal; and
superimposing, on the reference voltage, the superimposing signal based on the analog signal.

19. A DA converter comprising:
a DA converting unit to input a reference voltage and a digital value and output an analog signal according to the digital value based on the reference voltage;
a superimposing unit to superimpose, on the reference voltage, a superimposing signal based on the analog signal that is output from the DA converting unit; and
a setting input unit to input a setting regarding at least one of a superimposing amount and a sign of the analog signal to include in the superimposing signal, wherein
the superimposing unit adjusts the analog signal according to a setting input from the setting input unit and includes a resultant adjusted analog signal in the superimposing signal.

20. An adjusting apparatus to adjust the DA converter according to claim 19, comprising:
a supplying unit to supply a digital waveform to the DA converter;
a measuring unit to measure an analog waveform output from the DA converter according to the digital waveform;
a detecting unit to detect a harmonic distortion that is included in the analog waveform that is measured; and
a setting processing unit to supply a setting to reduce the harmonic distortion that is detected to the setting input unit of the DA converter.

21. The DA converter according to claim 19, wherein
the superimposing unit has a resistance that is connected between an output of the DA converting unit and the reference voltage.

22. The DA converter according to claim 19, further comprising a decoupling unit to decouple between the reference voltage that is input to the DA converter and a reference voltage that is input to at least one other circuit that shares a power source with the DA converter.

23. An adjusting method to adjust the DA converter according to claim 19, comprising:
supplying a digital waveform to the DA converter;
measuring an analog waveform output from the DA converter according to the digital waveform;
detecting a harmonic distortion that is included in the analog waveform that is measured; and supplying a setting to reduce the harmonic distortion that is detected to the setting input unit of the DA converter.

24. A DA converter comprising:

a DA converting unit to input a first reference voltage and a digital value and output an analog signal according to the digital value based on the first reference voltage; and a superimposing unit to superimpose, on the first reference voltage, a superimposing signal based on the analog signal that is output from the DA converting unit, wherein the superimposing unit has a resistance that is connected between an output of the DA converting unit and the first reference voltage; and a capacitor, one end of the capacitor being connected between the first reference voltage and the resistance and the other end of the capacitor being connected to a second reference voltage.

25. The DA converter according to claim 24, wherein the resistance has a resistance value that is greater than an output impedance of the DA converting unit.

* * * * *